(12) United States Patent
Furukawa et al.

(10) Patent No.: US 7,071,698 B2
(45) Date of Patent: Jul. 4, 2006

(54) POWER SUPPLY APPARATUS FOR DETECTING BATTERY VOLTAGE AND THE PORTIONS OF FAULTS

(75) Inventors: Kimihiko Furukawa, Kakogawa (JP); Kazuhiro Seo, Hirakata (JP); Yoshiaki Takahashi, Kobe (JP)

(73) Assignee: Sany Electric Co., Ltd., Osaka (JP)

( * ) Notice: Subject to any disclaimer, the term of this patent is extended or adjusted under 35 U.S.C. 154(b) by 0 days.

(21) Appl. No.: 11/083,089

(22) Filed: Mar. 18, 2005

(65) Prior Publication Data

US 2005/0231175 A1    Oct. 20, 2005

(30) Foreign Application Priority Data

Mar. 30, 2004  (JP) .............................. 2004-101543
Feb. 24, 2005  (JP) .............................. 2005-049258

(51) Int. Cl.
*G01N 27/416* (2006.01)
(52) U.S. Cl. ....................... 324/433; 320/145; 320/161
(58) Field of Classification Search ................ 320/128, 320/116, 129, 145, 161, 163; 324/433
See application file for complete search history.

(56) References Cited

U.S. PATENT DOCUMENTS 4,187,536 A * 2/1980 Govaert et al. .......... 363/21.17
4,275,344 A * 6/1981 Mori et al. ................. 322/28
4,742,296 A * 5/1988 Petr et al. ................... 324/142
6,411,098 B1 * 6/2002 Laletin ....................... 324/436
6,486,635 B1 * 11/2002 Matsuda et al. ............ 320/134
6,803,766 B1 * 10/2004 Kobayashi et al. ......... 324/434

FOREIGN PATENT DOCUMENTS

JP         2001-330653 A    11/2001

* cited by examiner

*Primary Examiner*—Adolf Deneke Berhane
*Assistant Examiner*—Aaron Piggush
(74) *Attorney, Agent, or Firm*—McDermott Will & Emery LLP

(57) ABSTRACT

A power supply apparatus according to the present invention includes a battery and a voltage detection circuit for detecting the voltage of the battery. The voltage detection circuit includes a differential amplifier which has a first input terminal for receiving a voltage based on the voltage of the battery and a second input terminal for receiving a predetermined triangular wave and outputs a rectangular wave with a pulse width modulated according to the voltage based on the voltage of the battery and a predetermined offset voltage, and an offset circuit which supplies the offset voltage to one of the first input terminal and the second input terminal so that the differential amplifier outputs a particular rectangular wave according to the offset voltage even when the voltage based on the voltage of the battery which is supplied to the first input terminal is 0.

7 Claims, 4 Drawing Sheets

POWER SUPPLY APPARATUS FOR DETECTING BATTERY VOLTAGE AND THE PORTIONS OF FAULTS

This application is based on Japanese Patent Applications Nos. 2004-101543 and 2005-049258 filed on Mar. 30, 2004 and Feb. 24, 2005, respectively, the contents of which are hereby incorporated by reference.

BACKGROUND OF THE INVENTION

1. Field of the Invention

The present invention relates to a power supply apparatus such as one designed for use in a vehicle to make it run. More particularly, the present invention relates to a power supply apparatus including a voltage detection circuit for a battery.

2. Description of Related Art

A power supply apparatus mounted on a vehicle such as a hybrid car or a fuel battery (fuel cell) powered vehicle includes a voltage detection circuit for detecting the voltage of the battery, in order to enable controlling the battery state based on the detected voltage of the battery. This type of power supply apparatus converts the battery voltage into a digital signal through an A/D converter and, then, supplies the digital signal to a microcomputer mounted on the vehicle. The circuit configuration of this type of power supply apparatus is disclosed, for example, in Japanese Patent Application Laid-Open No. 2001-330653 (hereinafter, referred to as Patent Document 1).

In the vehicular power supply apparatus disclosed in Patent Document 1, a voltage detection circuit for detecting the battery voltage is connected to an A/D converter, and the A/D converter is connected to a microcomputer.

A power supply apparatus mounted on a vehicle employs connectors and lead lines, called wire harnesses, for connections of electronic circuits, in the circuits for detecting the battery voltage and for outputting it to a microcomputer. The lead lines and the connectors in the vehicle are used in hostile external environments such as hostile temperatures and humilities, and are subjected to relatively strong vibrations. Since they are used in hostile environments such as dusty environments, they are prone to faults such as poor connection or brakes. Furthermore, most of portions include lead lines or connectors, which significantly complicates the identification of the portions of faults.

SUMMARY OF THE INVENTION

The present invention has been made in order to overcome the aforementioned drawbacks. It is an important object of the present invention to provide a power supply apparatus capable of simply, easily and immediately identifying the portions of faults.

In order to realize the aforementioned object, the present invention provides a power supply apparatus including a battery and a voltage detection circuit for detecting the voltage of the battery. Herein, the voltage detection circuit includes a differential amplifier which has a first input terminal for receiving a voltage based on the voltage of the battery and a second input terminal for receiving a predetermined triangular wave and outputs a rectangular wave with a pulse width modulated according to the voltage based on the voltage of the battery and a predetermined offset voltage, and an offset circuit which supplies the offset voltage to one of the first input terminal and the second input terminal so that the differential amplifier outputs a particular rectangular wave according to the offset voltage even when the voltage based on the voltage of the battery which is supplied to the first input terminal is 0.

One of the first input terminal and the second input terminal of the differential amplifier is fed with an offset voltage from the offset circuit. The differential amplifier outputs a rectangular wave with a pulse width modulated according to the voltage based on the voltage of the battery and the offset voltage. Even when the battery voltage is not input to the differential amplifier, namely, the voltage based on the voltage of the battery which is supplied to the first input terminal is 0, the differential amplifier outputs a rectangular wave according to the offset voltage supplied from the offset circuit.

Consequently, when the differential amplifier does not output a signal indicative of the voltage based on the battery voltage, it is possible to identify the portions of faults simply, easily and immediately, since it can be determined that there is a fault between the battery and the input of the differential amplifier when the differential amplifier outputs a signal indicative of the offset voltage, while it can be easily determined that there is a fault at the output side of the differential amplifier when the differential amplifier does not output a signal indicative of the offset voltage (namely, it does not output a rectangular wave).

Here, the first input terminal and the second input terminal of the differential amplifier may be, for example, the non-inverting input terminal and the inverting input terminal, respectively, of the differential amplifier. On the contrary, the first input terminal and the second input terminal of the differential amplifier may be, for example, the inverting input terminal and the non-inverting input terminal, respectively, of the differential amplifier.

For example, the voltage detection circuit may include an insulating coupler which transmits the rectangular wave output from the differential amplifier in an insulating manner, an integration circuit which integrates the output signal from the insulating coupler, and an A/D converter which converts the analog signal output from the integration circuit into a digital signal.

Since the rectangular wave output from the differential amplifier is transmitted to the integration circuit through the insulating coupler, the differential-amplifier side connected to the battery, which is a first voltage system (for example, a high-voltage system), and the integration-circuit side, which is a second voltage system (for example, a low-voltage system), are placed in an insulating manner. Consequently, the voltage of the battery in the first voltage system which is, for example, the high-voltage system can be detected at the integration-circuit side which is the low-voltage system.

Further, for example, the output of the insulating coupler may be connected to the integration circuit through a connector.

For example, the battery is constituted by a plurality of cells connected in serial, wherein one of the connection points of the plurality of cells is supplied with a predetermined reference potential, and the power supply apparatus includes two voltage detection circuits, wherein one of the voltage detection circuits detects the voltage at a positive-side output terminal of the battery relative to the connection point and the other voltage detection circuit detects the voltage at a negative-side output terminal of the battery relative to the connection point.

For example, the power supply apparatus may further include a triangular-wave generation circuit which generates the triangular wave, and a switching power supply circuit which supplies a power supply voltage for the triangular-wave generation circuit. Herein, the switching power supply circuit may include an activation switch which separates the triangular-wave generation circuit as a load for a predetermined time period, during the activation of the switching power supply circuit.

The power supply circuit for the differential-amplifier side which is the first voltage system may be configured to be the switching power supply circuit and the switching power supply circuit may be provided with an activation switch for separating the load during the activation. Therefore, even under hostile external conditions, the switching power supply circuit can be rapidly activated to stabilize the output.

For example, the power supply apparatus may further include a triangular-wave generation circuit which generates the triangular wave, and a switching power supply circuit which supplies electric power as a power supply to the triangular-wave generation circuit. Herein, the switching power supply circuit may include an activation switch capable of turning on and off the supply of electric power to the triangular-wave generation circuit which is a load, and the activation switch may be controlled such that the supply of electric power to the triangular-wave generation circuit is off for a predetermined time period during the activation of the switching power supply circuit.

The power supply circuit for the triangular-wave generation circuit placed in the first voltage system may be configured to be the switching power supply circuit and the switching power supply circuit may be provided with an activation switch for stopping the supply of electric power to the triangular-wave generation circuit for a predetermined time period during the activation. Therefore, even under hostile external conditions, the switching power supply circuit can be rapidly activated to stabilize the output.

DETAILED DESCRIPTION OF PREFERRED EMBODIMENTS

Hereinafter, embodiments of the present invention will be described based on the drawings. The embodiments which will be described later will merely exemplify a power supply apparatus for embodying the technical concept of the present invention and the present invention is not limited to the power supply apparatus which will be exemplified later.

A power supply apparatus according to the present invention is intended to be mounted on vehicles such as a hybrid car, a fuel vehicle and an electric vehicle, and is intended to be used as a power supply for driving a motor for moving a vehicle. However, the power supply apparatus according to the present invention may be used for any apparatuses, other than vehicles, employing batteries as a power supply.

Figure 1:
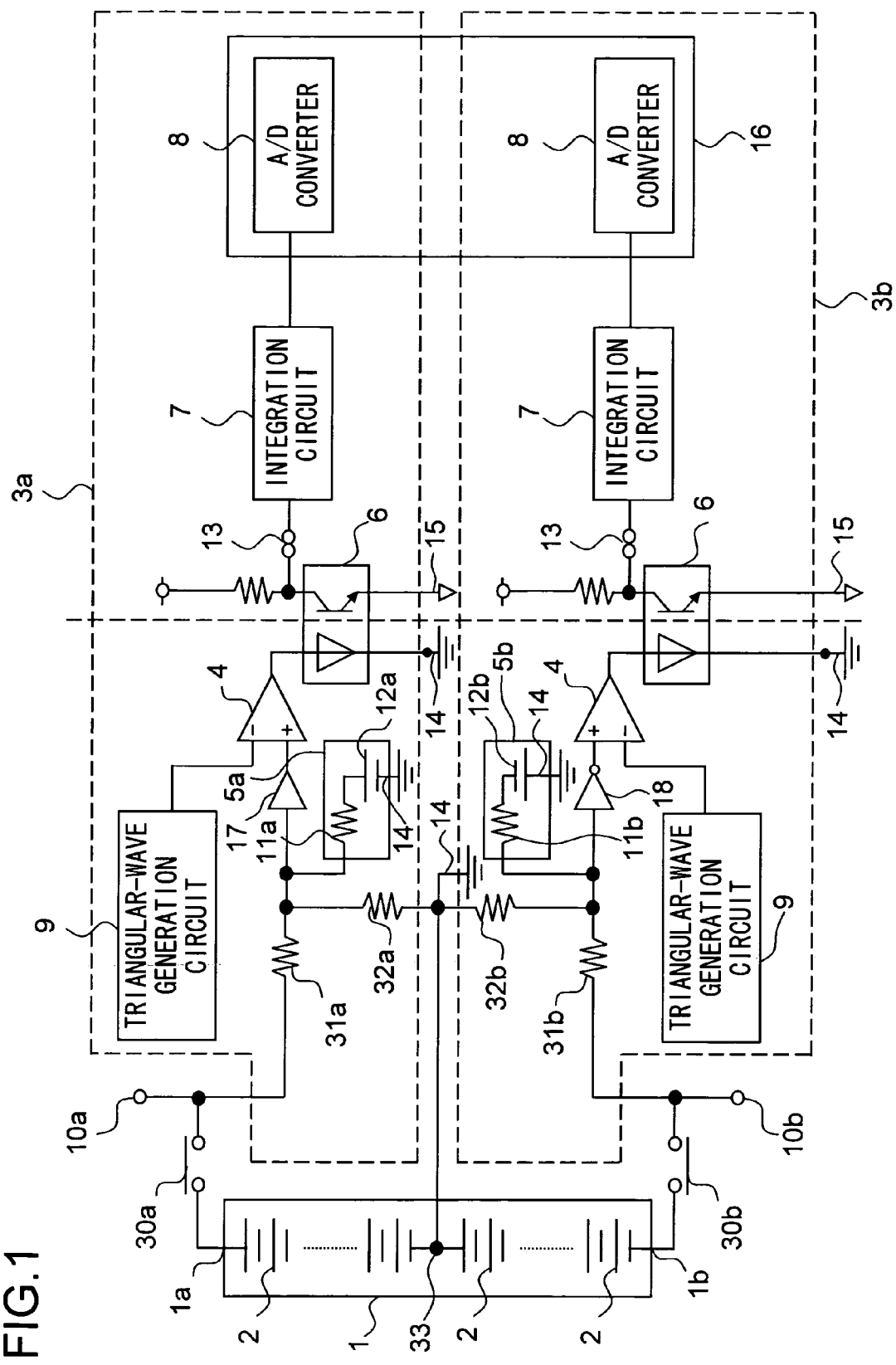
FIG. 1 is a circuit diagram of a power supply apparatus according to an embodiment of the present invention.

FIG. 1 illustrates a circuit diagram of the power supply apparatus. The power supply apparatus of FIG. 1 includes a battery (battery unit) 1 constituted by plural cells 2 which are serially connected, a switch 30a, a switch 30b, and two voltage detection circuits 3a, 3b for detecting the voltage of the battery 1. The following description will be given assuming that the switch 30a and the switch 30b are both on (conductive state).

A positive-side output terminal 1a for outputting a positive output voltage of the battery 1 is connected to the voltage detection circuit 3a and an output terminal 10a through the switch 30a, while a negative-side output terminal 1b for outputting a negative output voltage of the battery 1 is connected to the voltage detection circuit 3b and an output terminal 10b through the switch 30b. In the power supply apparatus of FIG. 1, the difference voltage between the voltage at the positive-side output terminal 1a and the voltage at the negative-side output terminal 1b appears as the battery voltage. The battery voltage is output from the pair of the output terminals 10a, 10b as the output voltage of the power supply apparatus of FIG. 1.

In the battery 1, the plural cells 2 are connected in serial to form cell modules, and the plural cell modules are further connected in serial to generate a high output voltage. Each of the cell modules is constituted by four to 10 cells 2 connected in serial. The cells 2 are, for example, nickel metal hydride cells or lithium ion secondary cells. However, the cells 2 may be any rechargeable cells, such as nickel-cadmium cells. The battery 1 is constituted by, for example, 30 to 60 cell modules connected in serial so that it generates an output voltage (the voltage between the output terminals 10a, 10b) within a range of 200 to 400 V.

The two voltage detection circuits 3a, 3b detect the voltage at the positive-side output terminal and the voltage at the negative-side output terminal, respectively, relative to a middle point 33 of the battery 1. More specifically, the voltage detection circuit 3a detects the voltage at the positive-side output terminal 1a (or the voltage at the output terminal 10a) relative to the voltage at the middle point 33 of the battery 1, while the voltage detection circuit 3b detects the voltage at the negative-side output terminal 1b (or the voltage at the output terminal 10b) relative to the voltage at the middle point 33 of the battery 1. The middle point 33 of the battery 1 is connected to a first ground line 14 and, thus, maintained at a predetermined reference potential.

At first, there will be given a description of the voltage detection circuit 3a, which is one of the two voltage detection circuits 3a, 3b.

The voltage detection circuit 3a is configured to include a differential amplifier 4 for converting the voltage at the positive-side output terminal 1a relative to the voltage at the middle point 33 into a rectangular wave with pulse width modulation, an offset circuit 5a for supplying an offset voltage to the input of the differential amplifier 4 in order to ensure that the differential amplifier 4 outputs a rectangular wave even when the battery voltage is not input thereto, an insulating coupler 6 for transmitting the rectangular wave from the differential amplifier 4 in an insulating manner, an integration circuit 7 for converting the variation in the pulse width of the rectangular wave generated from the pulse width modulation, which is output from the insulating coupler 6, into the variation in the smoothed voltage, namely, for integrating the rectangular wave generated from the pulse wave modulation, and an A/D converter 8 for converting the analog voltage signal after smoothing by the integration circuit 7 into a digital voltage signal. The voltage detection circuit 3a further includes a triangular-wave generation circuit 9 for generating a triangular wave, a connector 13, a buffer amplifier 17, a resistor 31a, and a resistor 32a.

The positive-side output terminal 1a of the battery 1 is connected to one end of the resistor 31a through the switch 30a. The other end of the resistor 31a is connected to the middle point 33 through the resistor 32a and also connected to the input terminal of the buffer amplifier 17 and the output of the offset circuit 5a.

The non-inverting input terminal (+) of the differential amplifier 4 is supplied with the output signal from the buffer amplifier 17 and the inverting input terminal (−) thereof is supplied with the triangular wave output from the triangular-wave generation circuit 9. The buffer amplifier 17 is an amplifier having a large input impedance, a small output impedance and an amplification factor of 1. By providing the buffer amplifier 17, the voltage at the positive-side output terminal 1a relative to the middle point 33 can be accurately transmitted to the differential amplifier 4. Incidentally, it is not necessarily required that the buffer amplifier 17 is provided in the voltage detection circuit 3a. In the case where the buffer amplifier 17 is not provided, it is desirable that the connection point between the resistor 31a and the resistor 32a is directly connected to the non-inverting input terminal (+) of the differential amplifier 4.

The offset circuit 5a is constituted by a direct reference power supply 12a for outputting a predetermined positive direct voltage relative to the first ground line 14, and a serial resistor 11a which is connected in serial to the direct reference power supply 12a. One end of the serial resistor 11a is connected to the terminal of the direct reference power supply 12a for generating the positive output voltage thereof and the other end is connected to the connection point of the resistor 31a, the resistor 32a and the input terminal of the buffer amplifier 17.

The insulating coupler 6 receives, at its input, the rectangular wave output from the differential amplifier 4 relative to the first ground line 14 and outputs, at its output, the rectangular wave output from the differential amplifier 4 relative to a second ground line 15. The first ground line 14 and the second ground line 15 are insulated from each other. The signals output from the output of the insulating coupler 6 are supplied to the integration circuit 7 through the connector 13.

The voltage detection circuit 3b is similar to the voltage detection circuit 3a. The voltage detection circuit 3b includes a differential amplifier 4, an insulating coupler 6, an integration circuit 7, an A/D converter 8, a triangular-wave generation circuit 9 and a connector 13, which are similar to those included in the voltage detection circuit 3a. A microcomputer 16 is configured to include the A/D converter 8 included in the voltage detection circuit 3a and the A/D converter 8 included in the voltage detection circuit 3b. In FIG. 1, like numerals refer to like elements. The functions of and connection relationship among the differential amplifier 4, the insulating coupler 6, the integration circuit 7, the A/D converter 8, the triangular-wave generation circuit 9 and the connector 13 included in the voltage detection circuit 3b are similar to those of the voltage detection circuit 3a and description thereof will be omitted. Hereinafter, only portions of the voltage detection circuit 3b which are different from the voltage detection circuit 3a will be described.

The voltage detection circuit 3b is provided with a buffer amplifier 18 which is an inverting amplifier, instead of the buffer amplifier 17. Further, the voltage detection circuit 3b is provided with an offset circuit 5b instead of the offset circuit 5a and is provided with a resistor 31b and a resistor 32b, instead of the resistor 31a and the resistor 32a.

The negative-side output terminal 1b of the battery 1 is connected to one end of the resistor 31b through a switch 30b. The other end of the resistor 31b is connected to the middle point 33 through the resistor 32b and, also, is connected to the input terminal of the buffer amplifier 18 and the output of the offset circuit.

The differential amplifier 4 in the voltage detection circuit 3b is supplied with the output signal from the buffer amplifier 18 at the non-inverting input terminal (+), and, also, is supplied with the triangular wave output from the triangular-wave generation circuit 9, at its inverting input terminal (−). The differential amplifier 4 in the voltage detection circuit 3b converts the voltage at the negative-side output terminal 1b relative to the voltage at the middle point 33 into a rectangular wave with pulse width modulation.

The buffer amplifier 18 provided in the voltage detection circuit 3b is an inverting amplifier as previously described. The inverting amplifier converts the negative voltage at the negative-side output terminal 1b relative to the voltage at the middle point 33 into a positive voltage. Since the buffer amplifier 18 is an inverting amplifier as previously described, the circuit configuration in the later stages rather than the buffer amplifier 18 can be made similar to those of the voltage detection circuit 3a in the positive side. However, it is not necessarily required that an inverting amplifier is provided at the input of the differential amplifier 4 in the voltage detection circuit 3b. In the case where an inverting amplifier is not provided therein, for example, the connection point between the resistor 31b and the resistor 32b may be connected to the inverting input terminal (−) of the differential amplifier 4 and the output of the triangular-wave generation circuit 9 may be connected to the non-inverting input terminal (+) of the differential amplifier 4. In this case, the same buffer amplifier (not shown) as the buffer amplifier 17 in the voltage detection circuit 3a may be inserted between the inverting input terminal (−) of the differential amplifier 4 and the connection point of the resistor 31b and the resistor 32b.

The offset circuit 5b is constituted by a direct reference power supply 12b for outputting a predetermined negative direct voltage relative to the first ground line 14, and a serial resistor 11b which is connected in serial to the direct reference power supply 12b. One end of the serial resistor 11b is connected to the terminal of the direct reference power supply 12b for generating the negative output voltage thereof and the other end is connected to the connection point of the resistor 31b, the resistor 32b and the input terminal of the buffer amplifier 18.

The direct reference power supply 12b in the offset circuit 5b may be the same as the direct reference power supply 12a in the offset circuit 5a, and the serial resistor 11b in the offset circuit 5b may be the same as the serial resistor 11a in the offset circuit 5a. However, the direct reference power supply 12a and the direct reference power supply 12b output voltages with different polarities to the first ground line 14.

The differential amplifier 4 in the voltage detection circuit 3a outputs a rectangular wave such that the greater the absolute value of the voltage at the positive-side output terminal 1a relative to the voltage at the middle point 33, the greater the pulse width of the rectangular wave. The differential amplifier 4 in the voltage detection circuit 3b outputs a rectangular wave such that the greater the absolute value of the voltage at the negative-side output terminal 1b relative to the voltage at the middle point 33, the greater the pulse width of the rectangular wave. Namely, each of the differential amplifiers 4 applies the pulse width modulation to the voltage of the battery 1 and outputs a rectangular wave with a pulse width which has been modulated depending on the voltage of the battery 1.

Figure 2:
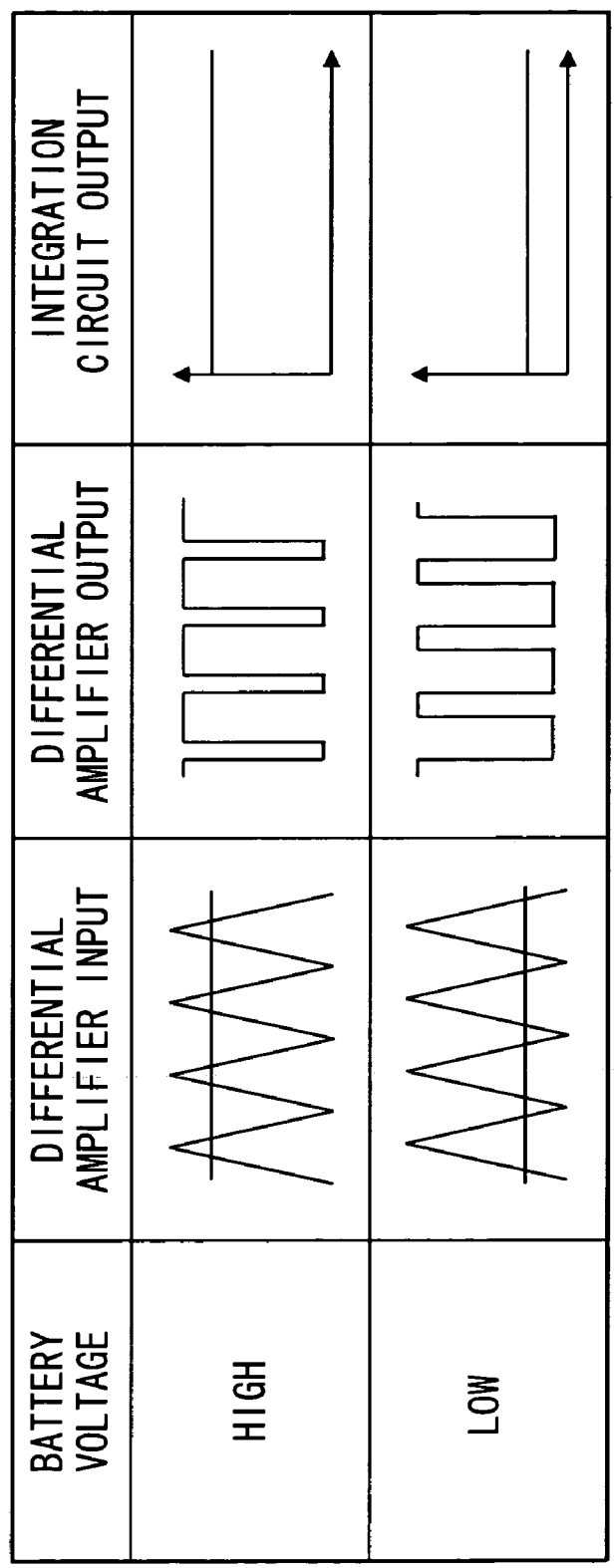
FIG. 2 illustrates the relationship between voltage waveforms at respective sections of the power supply apparatus of FIG. 1 and battery voltages.

FIG. 2 illustrates the states of the input voltage to each differential amplifier 4, the output voltage (rectangular wave) from each differential amplifier 4, and the output voltage of each integration circuit 7, when the voltage of the battery 1 is relatively high and low.

As illustrated in FIG. 2, as the voltage supplied to the non-inverting input terminal (+) of each differential amplifier 4 increases, the pulse width of the rectangular wave output from each differential amplifier 4 increases (the duty of the high electric potential increases). As a result, the output voltage output from each integration circuit 7 increases. On the contrary, as the voltage supplied to the non-inverting input terminal (+) of each differential amplifier 4 decreases, the pulse width of the rectangular wave output from each differential amplifier 4 decreases (the duty of the high electric potential decreases). As a result, the output voltage output from each integration circuit 7 decreases. When the voltage supplied to the non-inverting input terminal (+) of each differential amplifier 4 is 0 V, each differential amplifier 4 will output a rectangular wave with a pulse width of 0. Namely, it will not output a rectangular wave.

Since the power supply apparatus of FIG. 1 is mainly used in a vehicle, the inputs of the differential amplifiers 4 are connected to the pair of output terminals of the battery 1 (the output terminal 10a and the output terminal 10b) through lead lines. With this circuit configuration, there is a possibility that the input of the differential amplifier 4 in the voltage detection circuit 3a is not connected to the output terminal 10a or the input of the differential amplifier 4 in the voltage detection circuit 3b is not connected to the output terminal 10b. Such faults may be caused by breaks in the lead lines connecting therebetween or poor connections of the connectors (not shown) connecting the lead lines.

If there were not offset circuits 5a, 5b, each of the differential amplifiers 4 would not output a rectangular wave and each of the integration circuits 7 would have an output voltage of 0V when supplied with no voltage from the battery 1. In such a case, it would be impossible to distinguish whether the absence of output signals was caused by breaks in the connections between the battery 1 and the respective differential amplifiers 4 or faults in the circuits (for example, the integration circuits 7) in the later stages rather than the respective differential amplifiers 4. Although it is difficult to completely eliminate failures in the respective portions of the power supply apparatus for a vehicle, if it is possible to clearly distinguish the portions of failures, this will facilitate maintenance.

Therefore, in order to facilitate the identification of the portions of failures, the offset circuit 5a is provided in the voltage detection circuit 3a and the offset circuit 5b is provided in the voltage detection circuit 3b in the power supply apparatus of FIG. 1.

The offset circuit 5a supplies a predetermined offset voltage through the buffer amplifier 17 to the differential amplifier 4 in the voltage detection circuit 3a so that the differential amplifier 4 outputs a predetermined rectangular wave even when the differential amplifier 4 is not supplied, at its input, with a voltage based on the voltage of the battery 1, namely, when the connection between the positive-side output terminal 1a of the battery 1 and the connection point of the resistor 31a and the resistor 32a has been broken.

Consequently, the differential amplifier 4 in the voltage detection circuit 3a on the positive side outputs a rectangular wave with a pulse width which has been modulated according to the voltage based on the voltage of the battery 1 and the offset voltage output from the offset circuit 5a. Thus, the differential amplifier 4 outputs a predetermined rectangular wave rather than a direct voltage at 0 V even when the voltage based on the voltage of the battery 1, which is supplied to the non-inverting input terminal (+), is zero. The serial resistor 11a in the offset circuit 5a is provided in order to optimize the voltage value of the offset voltage supplied to the non-inverting input terminal (+) of the differential amplifier 4 in the voltage detection circuit 3a.

Similarly, the offset circuit 5b supplies a predetermined offset voltage through the buffer amplifier 18 to the non-inverting input terminal (+) of the differential amplifier 4 in the voltage detection circuit 3b so that the differential amplifier 4 in the voltage detection circuit 3b outputs a predetermined rectangular wave even when the differential amplifier 4 in the voltage detection circuit 3b is not supplied, at its input, with a voltage based on the voltage of the battery 1, namely, when the connection between the negative-side output terminal 1b of the battery 1 and the connection point of the resistor 31b and the resistor 32b has been broken.

Consequently, the differential amplifier 4 in the voltage detection circuit 3b on the negative side outputs a rectangular wave with a pulse width which has been modulated according to the voltage based on the voltage of the battery 1 and the offset voltage output from the offset circuit 5b. Thus, the differential amplifier 4 outputs a predetermined rectangular wave rather than a direct voltage at 0 V even when the voltage based on the voltage of the battery 1, which is supplied to the non-inverting input terminal (+), is zero. The serial resistor 11b in the offset circuit 5b is provided in order to optimize the voltage value of the offset voltage supplied to the non-inverting input terminal (+) of the differential amplifier 4 in the voltage detection circuit 3b.

In the voltage detection circuit 3a, the offset circuit 5a outputs a positive direct voltage (offset voltage) with the same polarity as that of the voltage at the positive-side output terminal 1a relative to the potential at the first ground line 14, and, in the voltage detection circuit 3b, the offset circuit 5b outputs a negative direct voltage (offset voltage) with the same polarity as that of the voltage at the negative-side output terminal 1b relative to the potential at the first ground line 14, in order to cause the respective differential amplifiers 4 to output rectangular waves even when the inputs of the differential amplifiers 4 are not supplied with voltages based on the voltage of the battery 1.

Also, in the voltage detection circuit 3a, the offset circuit 5a may be provided at the inverting input terminal (−) of the differential amplifier 4. Namely, the inverting input terminal (−) of the differential amplifier 4 in the voltage detection circuit 3a may be supplied with the triangular wave (which is output from the triangular-wave generation circuit 9 in the voltage detection circuit 3a), the voltage of which has been shifted by the amount of the offset voltage output from the offset circuit 5a. In such a case, it is desirable that the offset circuit 5a in the voltage detection circuit 3a outputs a negative direct voltage with a polarity opposite to that of the voltage at the positive-side output terminal 1a relative to the potential at the first ground line 14. Thus, even when the differential amplifier 4 in the voltage detection circuit 3a is not supplied, at its input, with the voltage based on the voltage of the battery 1, the differential amplifier 4 outputs a rectangular wave.

Similarly, in the voltage detection circuit 3b, the offset circuit 5b may be provided at the inverting input terminal (−) of the differential amplifier 4. Namely, the inverting input terminal (−) of the differential amplifier 4 in the voltage detection circuit 3b may be supplied with the triangular wave (which is output from the triangular-wave generation circuit 9 in the voltage detection circuit 3b) the voltage of which has been shifted by the amount of the offset voltage output from the offset circuit 5b. In this case, it is desirable that the triangular wave is shifted towards the negative-voltage side.

Figure 3:
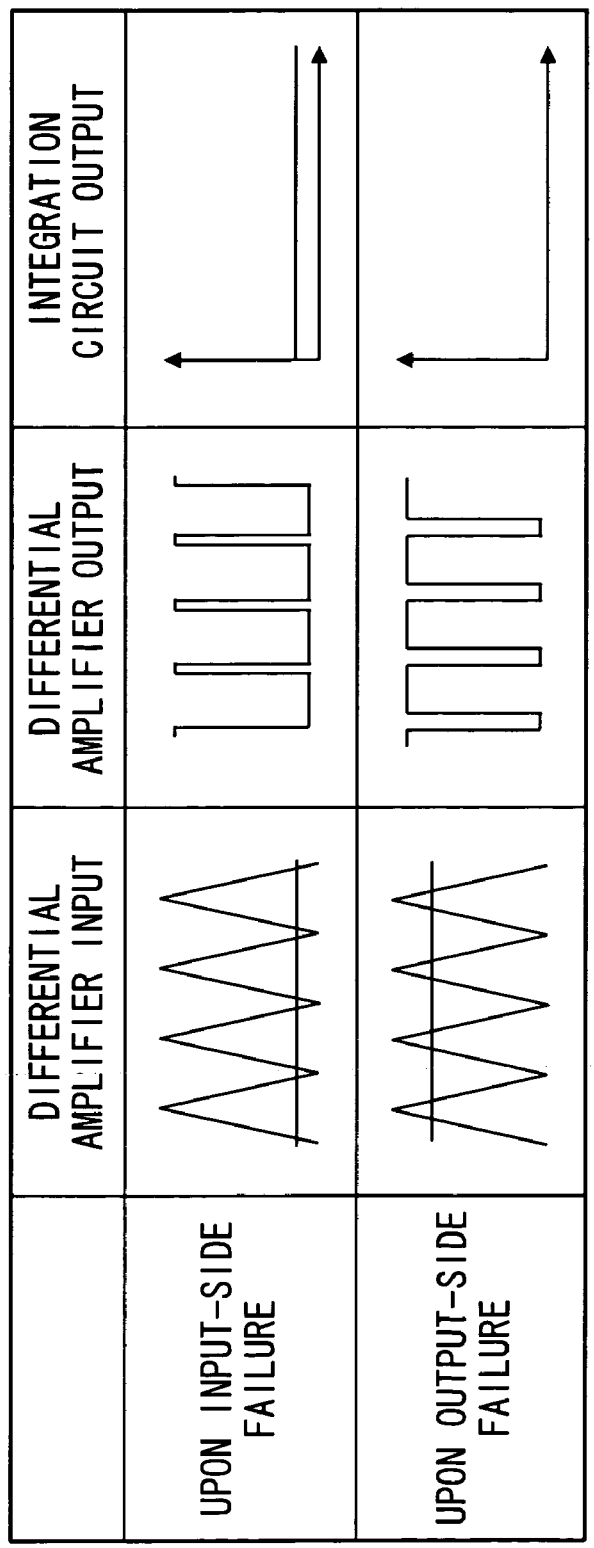
FIG. 3 illustrates the relationship between the voltage waveforms at the respective sections of the power supply apparatus of FIG. 1 and portions of faults.

Even when the connections between the outputs of the battery 1 and the inputs of the respective differential amplifiers 4 are broken thus resulting in absence of the battery voltage input to the non-inverting input terminals (+) of the respective differential amplifiers 4 (hereinafter, this state will be referred to as an "input-side failure"), the offset voltages are input to the non-inverting input terminals (+) of the respective differential amplifiers 4. Therefore, even in such a state, each differential amplifier 4 outputs a rectangular wave with a minimum width (a rectangular wave with a minimum high-potential duty ratio), as illustrated in FIG. 3. FIG. 3 illustrates the voltage waveforms at respective sections of the power supply apparatus of FIG. 1. The voltage waveforms in the upper boxes of FIG. 3 represent the states of an input voltage to each differential amplifier 4, an output voltage (rectangular wave) from each differential amplifier 4, and an output voltage of each integration circuit 7, in the event of an input-side failure.

The operations of the circuits in the later stages than the differential amplifiers 4 in the voltage detection circuits 3a and 3b are similar to each other. Therefore, there will be described only the operation of the circuits in the later stages than the differential amplifier 4 in the voltage detection circuit 3a, in the event of an input-side failure (which is, off course, similar to that of the voltage detection circuit 3b). In the voltage detection circuit 3a, the aforementioned rectangular wave with a minimum width is input to the A/D converter 8 through the insulating coupler 6 and the integration circuit 7 and is output from the A/D converter 8 as a digital voltage signal. At this state, the voltage signal output from the integration circuit 7 or the A/D converter 8 is a signal indicative of the offset voltage supplied to the differential amplifier 4. Thus, when the integration circuit 7 or the A/D converter 8 outputs a voltage signal indicative of the offset voltage, this clearly indicates that there is a brake or poor connection between the battery 1 and the input of the differential amplifier 4, thereby preventing the battery voltage from being normally input to the differential amplifier 4.

Further, as illustrated in the lower boxes in FIG. 3, when the integration circuit 7 or the A/D converter 8 in, for example, the voltage detection circuit 3a outputs a digital signal indicating that the battery voltage is 0 V, not a voltage signal indicative of the offset voltage, it can be determined that there is a failure which prevents the transmission of signals from the output of the differential amplifier 4 to the input of the integration circuit 7 or the A/D converter 8 (hereinafter, such a failure will be referred to as an "output-side failure"). The microcomputer 16 detects the occurrences of input-side failures or output-side failures, based on the output from the respective integration circuits 7 or the respective A/D converters 8. Incidentally, the voltage waveforms in the lower boxes in FIG. 3 represent the states of an input voltage to each differential amplifier 4, an output voltage (rectangular wave) from each differential amplifier 4, and an output voltage of each integration circuit 7, in the event of an output-side failure.

Failures which prevent normal signal transmissions are very likely to be caused by breaks in the lead lines or poor connections of the connectors. Thus, for example, when it is determined that there is a failure between the output of the differential amplifier 4 and the input of the A/D converter 8 in the voltage detection circuit 3a, it can be determined that there is a failure in the lead lines or the connectors therebetween (namely, most of the portions of failures can be identified).

Next, there will be described the detailed configurations of the insulating coupler 6 and the integration circuit 7 included in the voltage detection circuit 3a, which are similar to those of the insulating coupler 6 and the integration circuit 7 included in the voltage detection circuit 3b.

The insulating coupler 6 is a coupler which transmits signals while electrically insulating the input-side ground line and the output-side ground line from each other, and a photocoupler for transmitting signals through light is suitable as the insulating coupler 6. Also, the insulating coupler 6 may be an insulating coupler which transmits signals through a transformer. The insulating coupler 6 separates the grounds on the side of the differential amplifier 4, connected to the battery 1, from the grounds on the side of the detection circuit, including the integration 7 and the A/D converter 8 for detecting voltages. In the power supply apparatus for vehicles, the battery voltage is relatively high, and therefore the ground lines on the side of the differential amplifier 4 (namely, the first ground lines 14) is not connected to the chassis ground (the chassis of the vehicle).

On the other hand, on the side of the detection circuit, including the integration circuit 7 or the A/D converter 8 for detecting voltages, the ground lines for the electronic circuits (namely, the second ground lines 15) are connected to the vehicle chassis, in order to alleviate influences of noise, etc. The insulating coupler 6 transmits signals while separating the high-voltage side which is not connected to the vehicle chassis from the low-voltage side connected to the chassis. The output side of the insulating coupler 6 is connected to the integration circuit 7 through the connector 13, as illustrated in FIG. 1.

The integration circuit 7 is a low-pass filter and integrates the rectangular wave to convert it into a voltage signal proportional to the pulse width of the rectangular wave. The integration circuit 7 converts the rectangular wave into a smoothed voltage signal. The analog voltage signal output from the integration circuit 7 is converted into a digital voltage signal by the A/D converter 8.

Further, as previously described, in the power supply apparatus of FIG. 1, the two voltage detection circuits 3a, 3b detect the voltage at the positive-side output terminal and the voltage at the negative-side output terminal relative to the middle point 33 of the battery 1. The microcomputer 16 calculates the total voltage of the battery 1, based on the output from the A/D converter 8 in the voltage detection circuit 3a and the output from the A/D converter 8 in the voltage detection circuit 3b.

The power supply apparatus of FIG. 1 may be modified such that the total voltage of the battery 1 can be detected by a single voltage detection circuit. Such a modification can be achieved, for example, by eliminating the voltage detection circuit 3b from the power supply apparatus of FIG. 1, providing a differential input amplifier (not shown) for detecting the difference voltage between the positive-side output terminal 1a and the negative-side output terminal 1b of the battery 1 (namely, the total voltage of the battery 1), and supplying the output of the amplifier to the non-inverting input terminal (+) of the differential amplifier 4 in the voltage detection circuit 3a. In the case of applying such a modification, the negative-side output terminal 1b of the battery 1, instead of the middle point 33 of the battery 1, may be connected to the first ground line 14. The voltage at the positive-side output terminal 1a is supplied to the non-inverting input terminal (+) of the differential amplifier 4 in the voltage detection circuit 3a and thus the single voltage detection circuit 3a detects the total voltage of the battery 1.

Further, in the power supply apparatus in FIG. 1, there is a need for providing another power supply for operating the circuit including the ground lines which are not connected to the chassis ground (namely, the high-voltage circuit connected to the first ground line 14). In general, electronic circuits mounted on a vehicle operate with an electric-equipment battery of 12 V. Therefore, in the case of mounting the power supply apparatus of FIG. 1 on a vehicle, it is possible to utilize such an electric-equipment battery as the power supply for the high-voltage circuit connected to the first ground line 14. However, such an electric-equipment battery is typically connected at its negative side to the vehicle chassis, and therefore the utilization of the electric-equipment battery as the power supply for the high-voltage circuit will require insulating therebetween.

Figure 4:
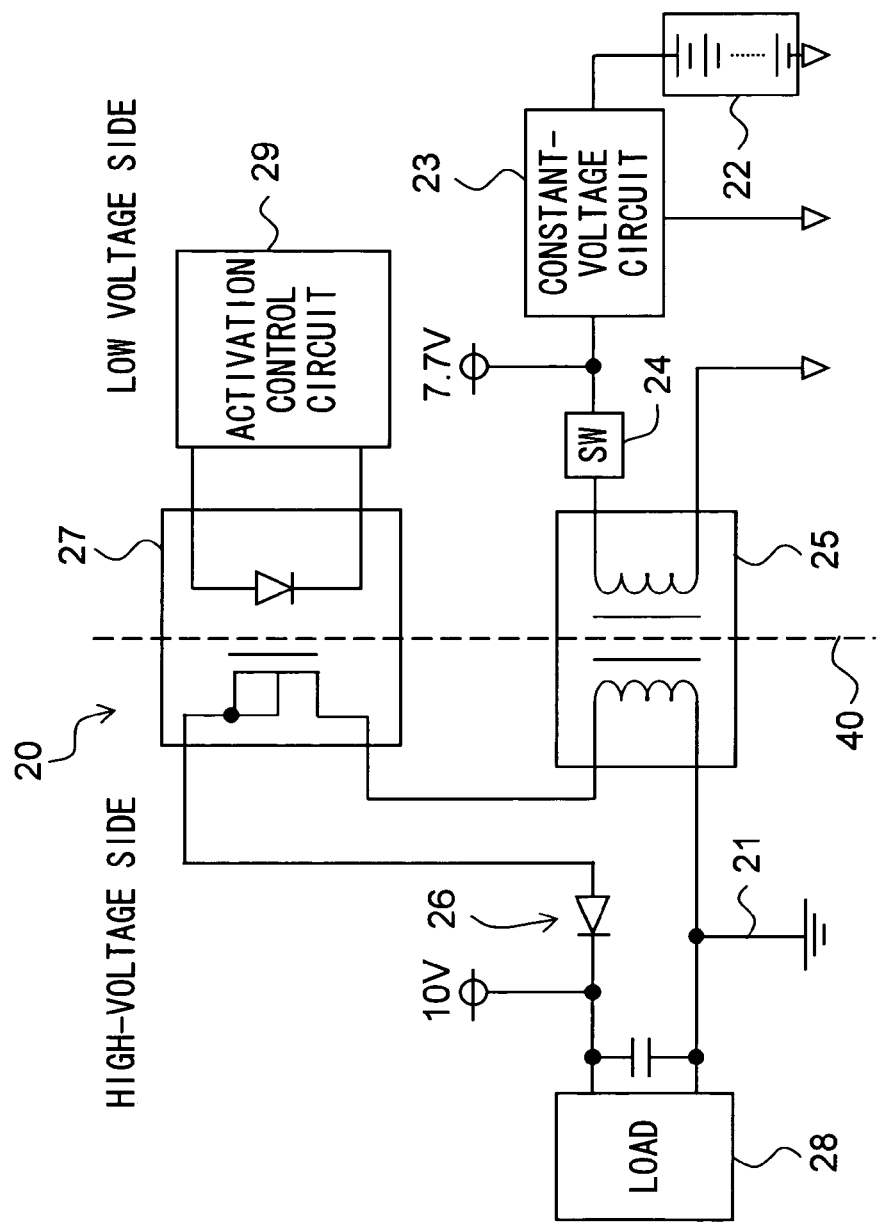
FIG. 4 is a block diagram illustrating an example of a power supply circuit for supplying electric power to a triangular-wave generation circuit or the like of FIG. 1.

In view of the aforementioned circumstances, there will be explained, hereinafter, a power supply circuit for the high-voltage circuit including the ground lines which are not connected to the chassis ground. FIG. 4 illustrates the circuit configuration of a switching power supply circuit 20 utilizing an electric-equipment battery 22 as a power supply. A primary-side ground line is connected to the chassis ground, and the electric-equipment battery 22, etc., are connected to the primary-side ground line. A secondary-side ground line 21 is insulated from the chassis ground and may be the ground line 14 in FIG. 1. A load 28 in the switching power supply circuit 20 is the high-voltage circuit including the ground lines which are not connected to the chassis ground (for example, the triangular-wave generation circuits 9, the differential amplifiers 4, the direct reference power supplies 12a and 12b, etc., illustrated in FIG. 1.).

The switching power supply circuit 20 includes a constant-voltage circuit 23 for maintaining the output of the electric-equipment battery 22 constant, a switching device 24 such as a transistor connected to the output of the constant-voltage circuit 23 to switch the output of the constant-voltage circuit 23, a transformer 25 including a primary winding connected to the switching device 24, a rectifier circuit 26 for converting an alternating voltage at the secondary winding of the transformer 25 generated from the switching operation of the switching device 24 into a direct voltage, an activation switch 27 for turning on and off the connection between the secondary winding of the transformer 25 and the load 28, and an activation control circuit 29 for controlling the activation switch 27.

The rectifier circuit 26 is, for example, a diode. The activation switch 27 is, for example, a photocoupler, and the activation control circuit 29 controls the current flowing through a diode at the input side of the photocoupler. A phototransistor at the output side of the photocoupler is connected at its source to the anode of the diode of the rectifier circuit 26 and also is connected at its drain to one end of the secondary winding of the transformer 25. When the phototransistor at the output side of the activation switch 27 is on, the load 28 is supplied with electric power (the supply of electric power is on). On the other hand, when the phototransistor at the output side of the activation switch 27 is off, the supply of electric power to the load 28 is stopped (the supply of electric power is off).

As sectioned by a dot line 40 in FIG. 4, the switching power supply circuit 20 is divided into the high-voltage side and the low-voltage side defined by the transformer 25 and the activation switch 27 such as a photocoupler. Thus, the switching power supply circuit 20 is configured to alleviate the influence of the high voltage at the high-voltage side on the low-voltage side. The input side of the activation switch 27 (photocoupler) and the primary winding of the transformer 25 are in the low-voltage side, while the output side of the activation switch 27 (photocoupler) and the secondary winding of the transformer 25 are in the high-voltage side.

The switching power supply circuit 20 further includes a control circuit (not shown) for detecting the output voltage of the switching power supply circuit 20 and for controlling the duty for switching the on/off of the switching device 24 such that the output voltage is stabilized. The output voltage of the constant-voltage circuit 23 is set to, for example, 7.7 V. The output voltage of the switching power supply circuit 20 is set to, for example, 10 V.

The activation switch 27 is maintained at the off state when activating the switching power supply circuit 20, and, after the activation, it is tardily turned on. Namely, the activation switch 27 (the phototransistor at the output side of the activation switch 27) is maintained at the off state for a predetermined time (for example, a few tens of microseconds to a few milliseconds) when activating the switching power supply circuit 20, and, after the predetermined time has elapsed, it is turned on. When the activation switch 27 (the phototransistor at the output side of the activation switch 27) in maintained at the off state, the supply of electric power to the load 28 is off.

Since the activation switch 27 is turned on with a delay during the activation, the switching power supply circuit 20 starts switching of the on/off of the switching device 24 under a condition where the load 28 is opened, namely, the load 28 is significantly light.

In general, vehicles are also used in extremely cold areas and thus are required to be capable of being stably used in areas where the outside-air temperature is below −20° C. When the outside-air temperature is significantly low, if the switching power supply circuit 20 is turned on with the load 28 connected thereto (if the switching power supply circuit 20 is activated, namely, the on/off switching of the switching device 24 is started from the state where the switching device 24 is maintained off), it will require a time to raise the output voltage. When the outside-air temperature drops to a significantly low temperature within a range of −20° C. to −40° C., the internal resistance of the load 28 will be reduced and the load for the switching power supply circuit 20 will be increased, thus preventing the output voltage from immediately rising to a predetermined voltage. If the power supply voltage for the load 28 has not normally risen after a certain time period has elapsed since the turning on of the ignition switch (not shown) of the vehicle, the microcomputer mounted on the vehicle may wrongly determine that a system error or the like has occurred.

In order to avoid such detriments, the switching power supply circuit 20 of FIG. 4 is provided with the activation switch 27 at the secondary side of the transformer 25, for separating the load 28 during the activation. When the load 28 is not connected to the switching power supply circuit 20, the switching power supply circuit 20 can be rapidly activated and then the activation switch 27 is turned on to stabilize the output.

Incidentally, while the middle point 33 of the battery 1 is connected to the first ground line 14 in the power supply apparatus of FIG. 1, other portions than the middle point 33 may be connected to the first ground line 14. It is necessary only that any one of the connection points of the plural cells 2 constituting the battery 1 is connected to the first ground line 14. For example, when the battery 1 is constituted by ten cells 2 connected in serial, there are nine connection points of the cells 2 and it is necessary only that any one of the nine connection points is connected to the first ground line 14.

Further, it is possible to interchange the signal supplied to the non-inverting input terminal (+) of the differential amplifier 4 in the voltage detection circuit 3a and the signal supplied to the inverting input terminal (−), as required. This is also applied to the differential amplifier 4 in the voltage detection circuit 3b. In the case of interchanging the signals supplied to the non-inverting input terminal (+) and the inverting input terminal (−), it is necessary to change the peripheral circuits as required.

Also, each of the voltage detection circuits 3a, 3b may be provided with a microcomputer 16.

What is claimed is:

1. A power supply apparatus comprising:
    a battery; and
    a voltage detection circuit for detecting the voltage of the battery, wherein the voltage detection circuit includes:
        a differential amplifier which has a first input terminal for receiving a voltage based on the voltage of the battery and a second input terminal for receiving a particular triangular wave and outputs a rectangular wave with a pulse width modulated according to the voltage based on the voltage of the battery and a predetermined offset voltage; and
        an offset circuit which supplies the offset voltage to one of the first input terminal and the second input terminal, and
    a polarity of the offset voltage is so set that the differential amplifier outputs a predetermined rectangular wave according to the offset voltage even when the voltage based on the voltage of the battery which is supplied to the first input terminal is 0.

2. The power supply apparatus according to claim 1, wherein
    the voltage detection circuit further includes:
    an insulating coupler which transmits the rectangular wave output from the differential amplifier in an insulating manner;
    an integration circuit which integrates an output signal from the insulating coupler; and
    an A/D converter which converts an analog signal output from the integration circuit into a digital signal.

3. The power supply apparatus according to claim 2, wherein
    the output of the insulating coupler is connected to the integration circuit through a connector.

4. The power supply apparatus according to claim 1, wherein
    the battery is constituted by a plurality of cells connected in serial, wherein one of connection points of the plurality of cells is supplied with a predetermined reference potential, and
    the power supply apparatus comprises two voltage detection circuits, wherein one of the voltage detection circuits detects a voltage at a positive-side output terminal of the battery relative to said one connection point and the other voltage detection circuit detects a voltage at a negative-side output terminal of the battery relative to said one connection point.

5. The power supply apparatus according to claim 1, further comprising: a triangular-wave generation circuit which generates the triangular wave; and
    a switching power supply circuit which supplies a power supply voltage for the triangular-wave generation circuit, wherein
    the switching power supply circuit includes an activation switch which separates the triangular-wave generation circuit as a load for a predetermined time period, during the activation of the switching power supply circuit.

6. The power supply apparatus according to claim 1, further comprising:
    a triangular-wave generation circuit which generates the triangular wave; and
    a switching power supply circuit which supplies electric power as a power supply to the triangular-wave generation circuit, wherein
    the switching power supply circuit includes an activation switch capable of turning on and off the supply of electric power to the triangular-wave generation circuit which is a load, and
    the activation switch is controlled such that the supply of electric power to the triangular-wave generation circuit is off for a predetermined time period during the activation of the switching power supply circuit.

7. The power supply apparatus according to claim 1, wherein
    the offset circuit generates the offset voltage from an output voltage of a power supply provided outside the differential amplifier.

* * * * *

UNITED STATES PATENT AND TRADEMARK OFFICE
CERTIFICATE OF CORRECTION

PATENT NO.        : 7,071,698 B2
APPLICATION NO. : 11/083089
DATED             : July 4, 2006
INVENTOR(S)       : Kimihiko Furukawa et al.

It is certified that error appears in the above-identified patent and that said Letters Patent is hereby corrected as shown below:

TITLE PAGE, Item "(73) Assignee:", change the first word in the Assignee's name from "Sany" to -- Sanyo --.

Signed and Sealed this

Nineteenth Day of December, 2006

JON W. DUDAS
*Director of the United States Patent and Trademark Office*